United States Patent [19]

Nilsson

[11] Patent Number: 4,539,575

[45] Date of Patent: Sep. 3, 1985

[54] RECORDER OPERATING WITH LIQUID DROPS AND COMPRISING ELONGATES PIEZOELECTRIC TRANSDUCERS RIGIDLY CONNECTED AT BOTH ENDS WITH A JET ORIFICE PLATE

[75] Inventor: Kenth Nilsson, Akersberga, Sweden

[73] Assignee: Siemens Aktiengesellschaft, Berlin & Munich, Fed. Rep. of Germany

[21] Appl. No.: 613,353

[22] Filed: May 23, 1984

[30] Foreign Application Priority Data

Jun. 6, 1983 [DE] Fed. Rep. of Germany ....... 3320441

[51] Int. Cl.[3] ...................... G01D 15/18; H01L 41/04

[52] U.S. Cl. ................................ 346/140 R; 346/1.1; 310/330; 310/368

[58] Field of Search ............ 346/140 PD, 1; 310/330, 310/331, 368

[56] References Cited

U.S. PATENT DOCUMENTS

| | | | |
|---|---|---|---|
| 3,370,187 | 2/1968 | Straube | 310/330 |
| 3,479,536 | 11/1969 | Norris | 310/330 X |
| 3,510,698 | 5/1970 | Massa | 310/330 |
| 4,072,959 | 2/1978 | Elmqvist | 346/140 PD |
| 4,140,936 | 2/1979 | Bullock | 310/331 X |
| 4,409,601 | 10/1983 | Nilsson et al. | 346/140 PD |
| 4,431,934 | 2/1984 | Kleinschmidt et al. | 310/331 |
| 4,438,441 | 3/1984 | Bolmgren et al. | 346/140 PD |

*Primary Examiner*—George H. Miller, Jr.
*Attorney, Agent, or Firm*—Hill, Van Santen, Steadman & Simpson

[57] ABSTRACT

In an illustrated transducer construction, electric potential changes applied to the transducer effect piezoelectric movement for causing recording fluid to be ejected through a jet orifice and applied on a recording carrier. In order to increase the maximum drop frequency and in order to improve the drop formation and drop speed, in accordance with the disclosure the linear distance of the connection points of the two ends of each transducer with the orifice plate is smaller than the length between the connection points as measured along the transducer. The transducers are thus mechanically prestressed to assume an arcuate configuration so that, in the rest state, recording fluid is disposed between the transducer and the plate. Given an electric driving pulse the transducers are shortened and conform with the plate in a planar fashion. Immediately after the excitation, each transducer returns to its arcuate initial configuration.

7 Claims, 4 Drawing Figures

RECORDER OPERATING WITH LIQUID DROPS AND COMPRISING ELONGATES PIEZOELECTRIC TRANSDUCERS RIGIDLY CONNECTED AT BOTH ENDS WITH A JET ORIFICE PLATE

BACKGROUND OF THE INVENTION

The invention relates to a recorder operating with liquid drops, for the purpose of recording at respective points on a recording medium so as to generate analog curves, alphanumeric characters, and/or images, such recorder comprising a plate with a row of jet orifices and a corresponding row of piezoelectric transducers each having an elongated configuration with a deflectable zone intermediate its ends and constructed such that electrical potential variations applied to the contacts of the transducers control the selective ejection of recording fluid from the respective jet orifices, according to the preamble of the present claim 1. A recorder of this type is known, for example, from U.S. Pat. No. 4,072,959. In one embodiment shown in this patent, a plate with conically shaped jet orifices is provided above which elongated piezoelectric transducers are arranged. The transducers are designed in the form of flexure elements and are connected at both ends via a cross-piece. Upon excitation of these elongated transducers, the latter initially lift off from the jet plate in a quasi-arcuate fashion and subsequently return to a flat configuration, whereby in each instance a drop is ejected through the associated jet orifice. The required duration of the excitation pulses is dependent upon the resonant frequency of the piezoelectric transducers and upon the attenuation properties of the system. In addition, it is substantially determined by the time which is necessary for filling the space between the transducer and jet plate with recording fluid. This filling time is inter alia dependent upon the viscosity and surface tension of the recording fluid, these characteristics being adaptable to only a limited extent in the case of an electrically non-conductive, non-drying, non-toxic, dyed recording fluid. Precisely in the case of the transducers which are fixed (or clamped) at both ends, the flow resistance for the filling of the fluid receiving space can be quite large, so that the duration of the excitation pulses is essentially dependent upon the filling time.

SUMMARY OF THE INVENTION

The object underlying the present invention, in the case of a recorder of the initially cited type, resides in raising the maximum drop ejection frequency and simultaneously improving the drop formation and drop speed.

In accordance with the invention, this object is achieved by virtue of the fact that the linear distance between the connection points at the respective ends of each transducer where such transducer is fixed to the plate is smaller than the length between these points as measured along the transducer. Accordingly, in rest position, the transducers are disposed arcuately between the mounting points above the jet plate. This has the advantage that there is constantly recording fluid present beneath the individual transducer elements when the transducers are in the quiescent condition. In order to eject a drop, such an electric potential is applied to the contacts of the corresponding piezoelectric transducer that the length of the transducer is shortened. The transducer is thus constricted into a planar configuration against the jet plate. Immediately after the excitation the transducer returns to its arcuate original position so that the entire time between two successive excitations is available for the purpose of filling with recording fluid. The further advantage is achieved that a critical over-excitation cannot arise since the elongated transducer can never become more than planar when in the energized condition. In the case of too great a voltage, the jet plate can merely become somewhat stressed and possibly the drop speed can be somewhat increased. Due to the insensitivity with respect to these over-excitations the possibility is provided of operating all transducers with voltage pulses of equal amplitude.

A further advantage is that, due to the rapid return to the arcuate original position immediately after excitation, a constriction of the drop is possible. In this manner, the problem of the ejected drop being unnecessarily retarded by a liquid thread which connects the drop with the liquid in the recording jet, before the drop becomes detached therefrom is prevented. In addition, the possibility exists of preventing the occurrence of so-called satellite or secondary drops. Altogether, a marked improvement of the recorded image is thereby rendered possible.

In a further development of the invention, it is provided that the piezoelectric transducers each is formed of a laminate consisting of piezoelectric ceramic and metal layers, wherein the metal layer faces the jet orifice. This metal layer increases the mechanical stability of the individual transducers. In addition, in the case of the present invention, however, it brings about yet another additional effect. As already stated, for the purpose of excitation such a potential is applied to the contacts of the transducer that the transducer becomes shortened and hence comes to lie in a planar fashion against the jet plate. Upon removal of the driving potential, in the case of transducers consisting solely of piezoceramic material, it could unfavorably lead to the result that the transducer does not return to its arcuate rest position. Through the additional metal layer, this is reliably prevented. Upon excitation, no active length change in the metal layer occurs so that the latter, when the transducer rests against the jet plate, is under mechanical compression which, after removal of the electric driving potential, immediately again returns the transducer to the arcuate position. Advantageously, for this purpose, the thickness of the metal layer can be smaller than that of the piezoceramic material.

In order to further simplify the rigid connection of the transducer ends with the jet plate it is provided that the metal layer extend at both ends beyond the piezoceramic material and that the transducer be connected in these regions with the jet plate. A simple and reliable connection results through welding.

A simple method for the application of the transducers on the jet plate consists in that first a spacer element is placed transversely so as to extend over the row of jet orifices. The elongated transducers are then bent over the spacer element prior to the connection of the ends of the transducers with the jet plate. After the connection of the transducer ends, the spacer is removed. A non-compressible filament or wire can be employed as the spacer element. By means of the spacer element, it is guaranteed that the transducers, in the region of the jet orifices, in rest position all have the same distance from the jet plate. Even if the length of the individual transducers should be subject to certain fluctuations, through this connection method, since the spacing of each transducer deflection zone from the jet plate is fixed and furthermore since the fastening points for the transducer ends are also fixed, in the case of all transducers, the same arcuate length and hence the same enclosed liquid volume is obtained.

Through the inventive design of the transducers, altogether the possibility is provided of manufacturing, in a simple manufacturing-technical fashion, a sturdy recorder with virtually any desired recording width. For example, if one assumes that a specific number of elongated transducers are respectively combined into one segment in such a fashion that the transducers are interconnected at both ends via a common body portion, then only a number-corresponding to the desired recording width-of such segments need be adjacently fixed on the jet plate.

It is pointed out here that the inventive transducer design exhibits a series of advantages also in relation to the known liquid jet recorders with strip-shaped transducers which are clamped only at one end. In the case of the latter, the ratio between the lateral bending strength and that in the deflection direction must be greater, as a consequence of which a thinner, and hence more sensitive ceramic is necessary which makes a higher quality of the ceramic and more careful processing necessary. Moreover, in the case of the strip-shaped transducers mounted at one end, a series of mounting problems occur which may possibly make a reinforcement of the strip-shaped transducers necessary and, in addition, very generally make far greater demands on the precision of the mounting.

Furthermore, the transducer fixed at one end, upon excitation, forces a large quantity of recording fluid which is located between the transducer and the plate in a longitudinal direction of the transducer, and not perpendicularly thereto, through the jet orifice. This additional work which the transducer performs in this manner is not exploited. The transducers according to the present invention also force recording fluid from the two mounting points in the direction of the center of the transducer. However, these two recording fluid waves are directed toward one another and meet in the center; i.e. in the region of the jet orifice from which they are then finally forced out. However, this means that the inventive transducer is a more effective "drop generator" than the known transducer which is fixed at only one end. The inventive liquid jet recorder thus has an improved electromechanical efficiency and can be operated with a lower electric voltage, as a consequence of which the entire energy consumption can be further reduced.

On the basis of four figures on the accompanying drawing sheet, exemplary embodiments of the invention shall be described in greater detail and explained in the following; and other objects, features and advantages will be apparent from this detailed disclosure and from the appended claims.

DETAILED DESCRIPTION

Figure 3:
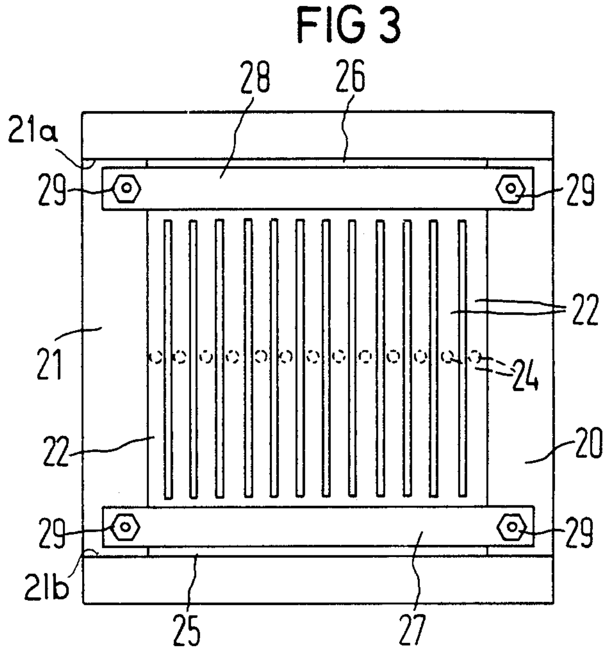
FIG. 3 shows a plan view of the jet plate according to FIG. 2.
Figure 4:
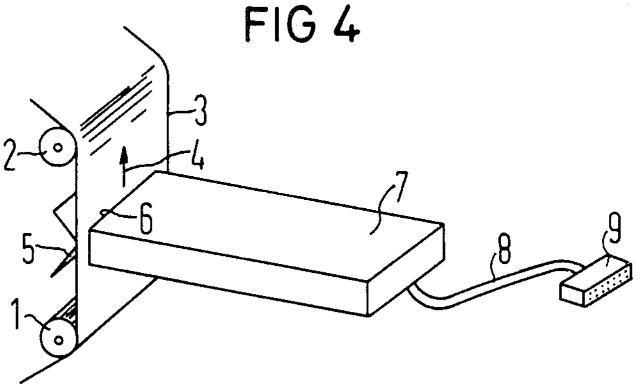
FIG. 4 shows a schematic overall view of a recorder.

From FIG. 4, the exterior basic construction of the recorder is apparent. The recording carrier (normally recording paper) 3 is drawn past the recording location via transport rollers 1 and 2 in the direction of the arrow 4 over the spacer 5 and in spaced relation to an end face 6 of a transducer housing 7. Extending into the housing 7 is a connection cable 8 which is provided at its free end with a plug 9 for the purpose of connection to a corresponding control device which supplies the control signals for the recording of the desired patterns, characters, or images. The end face 6 of the housing 7 contains the jet plate, represented in FIGS. 1 through 3, whereby a row of jet orifices is arranged transversely to the paper transport device; if possible, the orifices are arranged across the entire paper width. It is also conceivable to place the jet orifices in a row extending longitudinally in the paper transport direction and to shift the transducer transversely to the paper transport direction. Such a transversely shiftable transducer may also have a plurality of rows of jet orifices with each row extending parallel to the direction of paper transport indicated by arrow 4.

Figure 1:
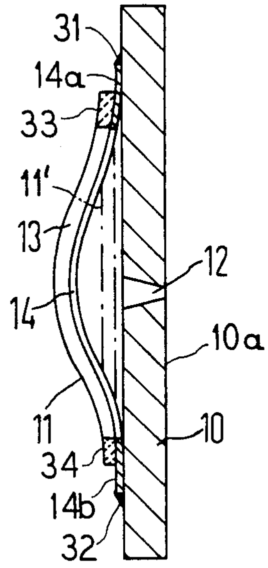
FIG. 1 shows in section a lateral view of the jet plate with the inventive elongated transducer construction.

FIG. 1 shows a section of a jet plate 10 with the inventive elongated transducers 11. The jet plate 10 contains jet orifices 12 of conical configuration. Above each jet orifice 12, a transducer 11 is arranged. According to FIG. 1, the transducer is formed of bilaminar material consisting of a piezoelectric ceramic layer 13 and a metal layer 14, for example, nickel. The thickness of the nickel layer 14 is substantially less than the thickness of the piezoelectric material. Moreover, the nickel layer 14 extends beyond the ends of the piezoelectric layer 13. In these, projecting regions the nickel layer is fixedly connected with the jet plate 10 by means of welding.

As can be learned from FIG. 1, the transducer 11 is somewhat arcuately curved. The distance between the connection points can amount to, for example, 5 mm. The maximum distance of the transducer 11 from the jet plate 10 is to amount to, for example, 30 $\mu$m. The necessary length of the transducer in the non-excited state, therefore, need be only slightly greater than the distance between the fixation points. In the selected example, the length of the transducer (along its curved surfaces) between the fixation points amount to approximately 5.001 mm.

In the exemplary embodiment of FIG. 1, a representation of the electrical contacting or electrodes of the transducer has not been shown. If, however, a voltage is applied to the electrodes the transducer is shortened and passes into the constricted position illustrated by broken lines at 11'; The recording fluid disposed between transducer 11 and jet plate 10 is thus ejected through the jet orifice 12.

Figure 2:
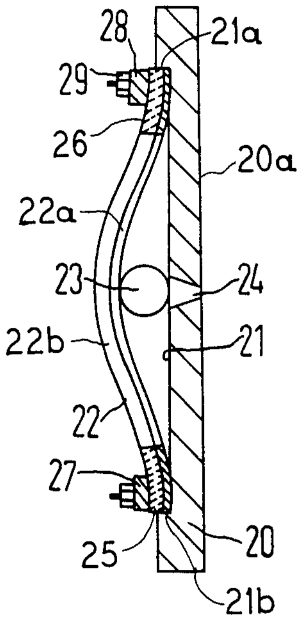
FIG. 2 shows a variant of the transducer mounting, again in section.

FIG. 2 shows a somewhat modified exemplary embodiment. The sole difference consists in the connection of the transducer ends with the jet plate. In this embodiment of FIG. 2, the jet plate 20 is provided with a recess 21 into which the ends of the curved transducers 22 engage. The length of the metal layer **22*a* is equal to that of the piezoelectric material layer 22*b*. Via a clamp 27, 28 and threaded fasteners 29 the transducer ends are pressed into the groove 21. In FIG. 2, it is simultaneously indicated how the transducers are assembled on the jet plate 20. For this purpose, a stiff cylindrical filament 23 is provided as the spacer element and is stretched perpendicularly to the transducers transversely across the jet plate precisely over the row of jet orifices 24. The transducer elements are then placed over the filament 23 and the ends are bent in the direction of the jet plate 20 and connected with the jet plate. Subsequently, the filament 23 is withdrawn. It is thus guaranteed that all transducers 22, in rest position, have the same distance from the jet plate 20 at their central deflection regions, which distance corresponds to the diameter of cylindrical filament 23**.

FIG. 3 shows a plan view of a jet plate 20 with transducers 22 according to FIG. 2. As can be learned from FIG. 3, the transducers 22 are interconnected at their two ends via body portions 25 and 26, respectively. This considerably simplifies the manufacture of such a transducer segment comprising a plurality of parallel-disposed transducers. From a plate-shaped laminate, through sawing-in of equal-length slits, the elongated transducers 22, disposed precisely parallel to one another, are produced. After the transducers in the arcuate state are inserted with their body portions 25, 26 in the recess 21, they are fixed in this position by means of two clamps 27, and 28, respectively, which, in this exemplary embodiment, are mounted with four bolts 29 on the jet plate.

In the exemplary embodiment according to FIG. 3, only one segment with a relatively small number of jet orifices 24 and transducers 22 disposed thereabove is illustrated. Through joining together of segments of this type the recording width can be adjusted to a desired dimension.

It will be apparent that many modifications and variations may be made without departing from the scope of the teachings and concepts of the present invention.

Supplementary Discussion

For a housing 7 as shown in FIG. 4, the frontal wall 10*a*, of the plate 10 of FIG. 1 or the frontal wall 20*a* of the plate 20 of FIGS. 2 and 3 may provide the frontal end face 6 of the housing. The spacer 5 may have a smooth face for supporting the recording medium 3 in a plane which is spaced from the outlet sides of the orifices 12 or 24 by a suitable distance.

In FIG. 1 the extensions 14*a* and 14*b* of the metal layer 14 are indicated as being secured to the plate 10 by welds at 31 and 32. Thus the length along the metal layer 14 between welds 31 and 32, in the deenergized condition of the transducer, may exceed the straight line separation between welds 31 and 32 by about 0.02%, for example. In FIGS. 2 and 3, the length along the transducers 22 between edges 21*a* and 21*b* of the groove 21 in the plate 20 may exceed the straight line distance between edges 21*a* and 21*b* by about 0.02%, in the deenergized condition of the transducer. Tolerance in the length of transducers 22 may be such as to insure that each transducer firmly engages spacer 23 as shown in FIG. 2.

The transducer arrangement of FIG. 1 may have a segment configuration as shown in FIG. 3 wherein the individual transducers are connected by common base portions 33 and 34 corresponding to base portions 25 and 26 in FIGS. 2 and 3. The base portions 33 and 34 may include piezoceramic and metal layer portions bonded together. The layers 13 and 14 may be bonded together continuously over their mating surfaces, and the layers 22*a* and 22*b* in FIGS. 2 and 3 may also be bonded together over the entire mating surfaces thereof. The electrical contacting or electrodes, however, must not have any connection between the individual transducers. A filament such as shown at 23 in FIG. 2 may be utilized during the assembly of a segment or segments of transducers 11 over a row of jet orifices 12 for the embodiment of FIG. 1 the same as described for FIGS. 2 and 3.

I claim as my invention:

1. A recorder operating with liquid drops for the purpose of recording analog curves, alphanumeric characters, and/or images, said recorder comprising a plate with a row of jet orifices for the purpose of recording individual points, elongated piezoelectric transducers being arranged over the inlet sides of the respective jet orifices, said transducers being disposed parallel to one another with their respective opposite ends being rigidly secured at respective connection points with the plate, said transducers each being constructed such that an intermediate deflection zone thereof can be deflected as a result of electrically produced piezoelectric movement, to eject recording fluid through a respective associated jet orifice for application to a recording medium arranged at the discharge side of the jet orifices, the linear distance between the connection points at the respective ends of each transducer being less than the length along the transducer between said connection points.

2. A recorder according to claim 1, characterized in that the transducers are formed of a laminate of a layer of piezoceramic material and a metal layer, the metal layer facing the plate with the jet orifices therein.

3. A recorder according to claim 2, characterized in that the thickness of the metal layer is smaller than that of the layer of piezoceramic material.

4. A recorder according to claim 2, characterized in that the metal layer has extensions at both ends extending beyond the piezoceramic material, and the trandsucer being rigidly connected with the plate at said extensions thereof.

5. A method for connecting elongated piezoelectric transducers with a jet plate, said method producing an elongated transducer construction such that an intermediate deflection zone can be driven toward the jet plate as a result of electrically produced piezoelectric movement to eject recording fluid through a respective associated jet orifice for application to a recording medium, said method comprising placing a spacer element over a row of jet orifices in the jet plate, curving the elongated transducers over the spacer element, connecting the ends of the transducers to the jet plate at respective connection points having a linear separation less than the distance between said connection points as measured along the transducer, and removing the spacer element.

6. A method according to claim 5, characterized in that a stiff filament or wire is employed as the spacing element.

7. A method according to claim 5, characterized in that the transducer ends are connected with the plate through welding.

* * * * *